(12) United States Patent
Bergevin et al.

(10) Patent No.: US 7,651,952 B2
(45) Date of Patent: Jan. 26, 2010

(54) AERODYNAMIC SHAPES FOR WAFER STRUCTURES TO REDUCE DAMAGE CAUSED BY CLEANING PROCESSES

(75) Inventors: Christopher W. Bergevin, San Jose, CA (US); Shawn M. Collier Hernandez, Gilroy, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 217 days.

(21) Appl. No.: 11/960,662

(22) Filed: Dec. 19, 2007

(65) Prior Publication Data

US 2009/0162947 A1    Jun. 25, 2009

(51) Int. Cl.
*H01L 21/461* (2006.01)
(52) U.S. Cl. ...................................... 438/749
(58) Field of Classification Search ............. 438/706, 438/749, 905, 974
See application file for complete search history.

(56) References Cited

U.S. PATENT DOCUMENTS

| | | | |
|---|---|---|---|
| 5,486,139 A * | 1/1996 | Papp | 454/123 |
| 5,810,942 A | 9/1998 | Narayanswami et al. | |
| 6,036,781 A | 3/2000 | Ahn et al. | |
| 6,449,873 B1 | 9/2002 | Yoon et al. | |
| 2004/0127044 A1 | 7/2004 | Verhaverbeke et al. | |
| 2005/0126605 A1 | 6/2005 | Yassour et al. | |
| 2009/0162947 A1 * | 6/2009 | Bergevin et al. | 438/3 |

FOREIGN PATENT DOCUMENTS

| | | |
|---|---|---|
| JP | 04100231 | 4/1992 |
| JP | 10242105 | 9/1998 |
| JP | 2001291693 | 10/2001 |
| JP | 2003190894 | 7/2003 |

* cited by examiner

*Primary Examiner*—Calvin Lee
(74) *Attorney, Agent, or Firm*—Duft Bornsen & Fishman, LLP

(57) ABSTRACT

Wafer structures and associated methods of fabrication are described. The wafer structures are fabricated to have aerodynamic shapes. Even if the structures on the wafer are fragile, the aerodynamic shapes of the structures create less resistance to a fluid flow of a cleaning process, and are less likely to be damaged by the cleaning process. Also, the aerodynamic shape of the structures allows a fluid flow to be directed toward the wafer from a single angle to effectively clean the wafer.

8 Claims, 9 Drawing Sheets

AERODYNAMIC SHAPES FOR WAFER STRUCTURES TO REDUCE DAMAGE CAUSED BY CLEANING PROCESSES

BACKGROUND OF THE INVENTION

1. Field of the Invention

The invention is related to the field of wafer fabrication and, in particular, to fabricating wafer structures with aerodynamic shapes so that the structures are less likely to be damaged during cleaning processes.

2. Statement of the Problem

Wafer fabrication is a procedure composed of many repeated sequential processes of depositing layers of material, and patterning the deposited layers to produce structures for electrical circuits, devices, chips, etc. For example, wafer fabrication is typically used to build semiconductor components, such as amplifiers, transistors, and MEMS devices. Wafer fabrication is also used to build magnetic recording or magnetic memory devices, such as magnetoresistance (MR) read elements, write elements, etc. Some of the processes commonly used in wafer fabrication are photolithography, nanoimprint lithography, etc.

Photolithography is a process used to selectively remove parts of a thin film. As an example of photolithography, a wafer is covered with photoresist. An exposure system then shines ultraviolet light through a photomask to produce an image on the photoresist. The ultraviolet light changes the chemistry of the exposed photoresist, which allows a solution, referred to as a "developer", to remove the exposed photoresist. The result is a photoresist on the wafer having a desired pattern. The pattern in the photoresist is then used to pattern one or more layers on the wafer to form the desired structures. For instance, a milling process may be used to remove any material that is exposed by the photoresist to form structures underneath the photoresist. In another instance, a material may be plated or deposited on areas of the wafer that are exposed by the photoresist to form the structures. After the structures are formed, the photoresist is removed.

Subsequent to wafer fabrication processes forming structures, a cleaning process may be performed to remove residual particles which remain on the structures due to surface tension, re-deposition, etc. If the residual particles are not removed by the cleaning process, then the particles may cause problems in subsequent processing steps or in the final product.

In one common cleaning process, a high-velocity fluid flow, such as carbon dioxide in a supercritical state, is directed onto the surface of the wafer. As the fluid flow passes over the wafer, the flow removes residual particles from the surfaces that are exposed to the flow. The fluid flow is typically directed onto the surface of the wafer from multiple angles or is swept between multiple angles. For instance, assume that a structure has a square or rectangular shape. To remove residual particles from each side of the structure, the flow should be directed towards the structure from all four sides. Also, the structures may have indentations or pockets where residual materials are trapped. Directing the fluid flow from multiple angles helps to remove these residual materials from the indentations or pockets.

In present wafer fabrication, the structures being built are getting smaller and smaller, such as on the nanometer scale. One problem encountered is that the small structures tend to be fragile and the cleaning processes may damage the structures on the wafer. To avoid damaging the structures, the velocity of the flow may be reduced, or the flow may be directed along the wafer's minimum cross section. This unfortunately reduces the effectiveness of the cleaning process.

It is therefore desirable to develop wafer fabrication techniques that generate small structures on a wafer, but also facilitate cleaning processes performed on the wafer.

SUMMARY OF THE SOLUTION

Embodiments of the invention address these problems by fabricating the structures on the wafer to have aerodynamic shapes. Even if the structures on the wafer are fragile, the aerodynamic shapes of the structures have less drag caused by the fluid flow of a cleaning process, and are less likely to be damaged by the cleaning process. Also, higher-velocity flows may be used to enhance the cleaning process while reducing the risk of damaging the structures on the wafer.

Yet another advantage is that the fluid flow may be directed toward the wafer from a single angle or direction. Aerodynamic shapes have a leading edge that is defined by its shape. If the fluid flow is directed towards the leading edge of the structure, then the fluid flow will travel around the surfaces of the structure and remove any residual material. The cleaning process thus does not need to be performed from multiple angles.

One embodiment of the invention comprises a method of wafer fabrication that facilitates cleaning of a wafer subsequent to lithographic processes defining sub-millimeter structures on the wafer. One step of the method comprises fabricating one or more sub-millimeter structures on the wafer. The structure(s) is defined through lithographic processes to have an effective shape that is substantially aerodynamic. The aerodynamic shape facilitates a subsequent cleaning process in removing residual material from the sub-millimeter structure(s). Another step of the method comprises directing a fluid flow substantially toward a leading edge of the sub-millimeter structure(s) to remove the residual material. The aerodynamic shape of the sub-millimeter structure(s) enhances the cleaning process.

Another embodiment includes a method of fabricating magnetic recording heads on a wafer to facilitate cleaning of the wafer subsequent to lithographic processes patterning layers of the magnetic recording heads. The method comprises fabricating a magnetic write pole having a yoke portion and a pole tip, and also fabricating an anchor structure having a first end integral with the pole tip. The anchor structure has a first side surface and a second side surface connecting the first end to a second distal end, where the first side surface and the second side surface each camber between the first end and the second end to define an effective shape that is substantially aerodynamic. The aerodynamic shape of the anchor structure (and the pole tip) facilitates a fluid-flow cleaning process in removing residual material from the anchor structure and the write pole. Another step of the method comprises directing a fluid flow substantially toward the second end of the anchor structure to clean and remove the residual material. The aerodynamic shape of the anchor structure and the write pole enhances the cleaning process.

The invention may include other exemplary embodiments described below.

DESCRIPTION OF THE DRAWINGS

The same reference number represents the same element or same type of element on all drawings.

DETAILED DESCRIPTION OF THE INVENTION

FIGS. 1-9 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
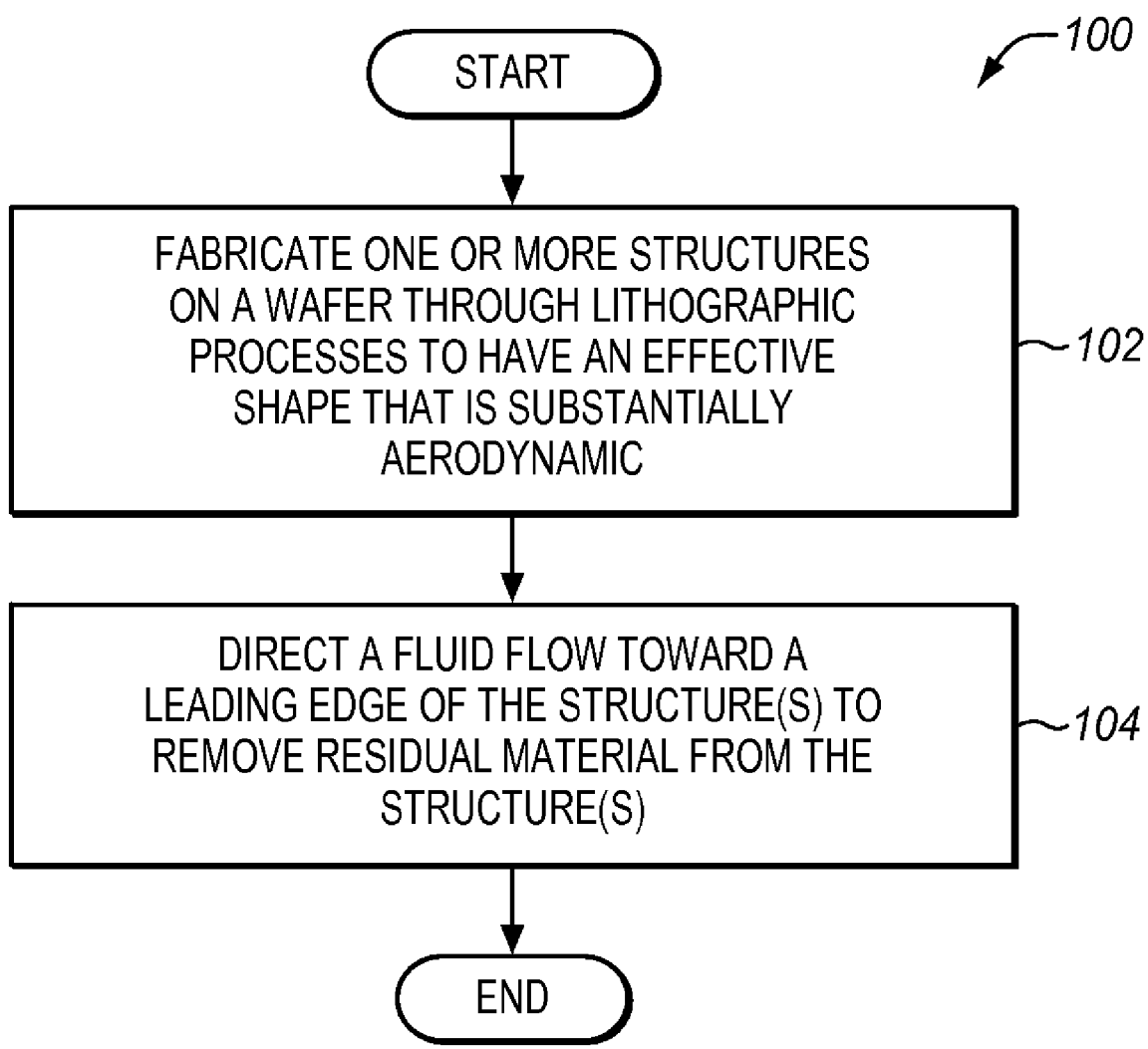
FIG. 1 is a flow chart illustrating a method of wafer fabrication that facilitates cleaning of a wafer subsequent to lithographic processes defining sub-millimeter structures on the wafer in an exemplary embodiment of the invention.

FIG. 1 is a flow chart illustrating a method 100 of wafer fabrication that facilitates cleaning of a wafer subsequent to lithographic processes defining sub-millimeter structures on the wafer in an exemplary embodiment of the invention. Method 100 is not all-inclusive, and may include other steps not shown for the sake of brevity.

Step 102 comprises fabricating one or more structures on a wafer through lithographic processes. The structures being fabricated on the wafer are small in this embodiment, meaning they are in the sub-millimeter scale. For instance, the structures may be Micro-Electro-Mechanical-Systems (MEMS) structures, may be structures formed for magnetic recording heads (i.e., a write pole of a magnetic recording head), or other small structures. The lithographic processes used to fabricate these small structures may be photolithographic processes, nanoimprint lithographic processes, or any other process comprised of sequential steps of depositing and removing material on a wafer and patterning the deposited material to form the structures.

Figure 2:
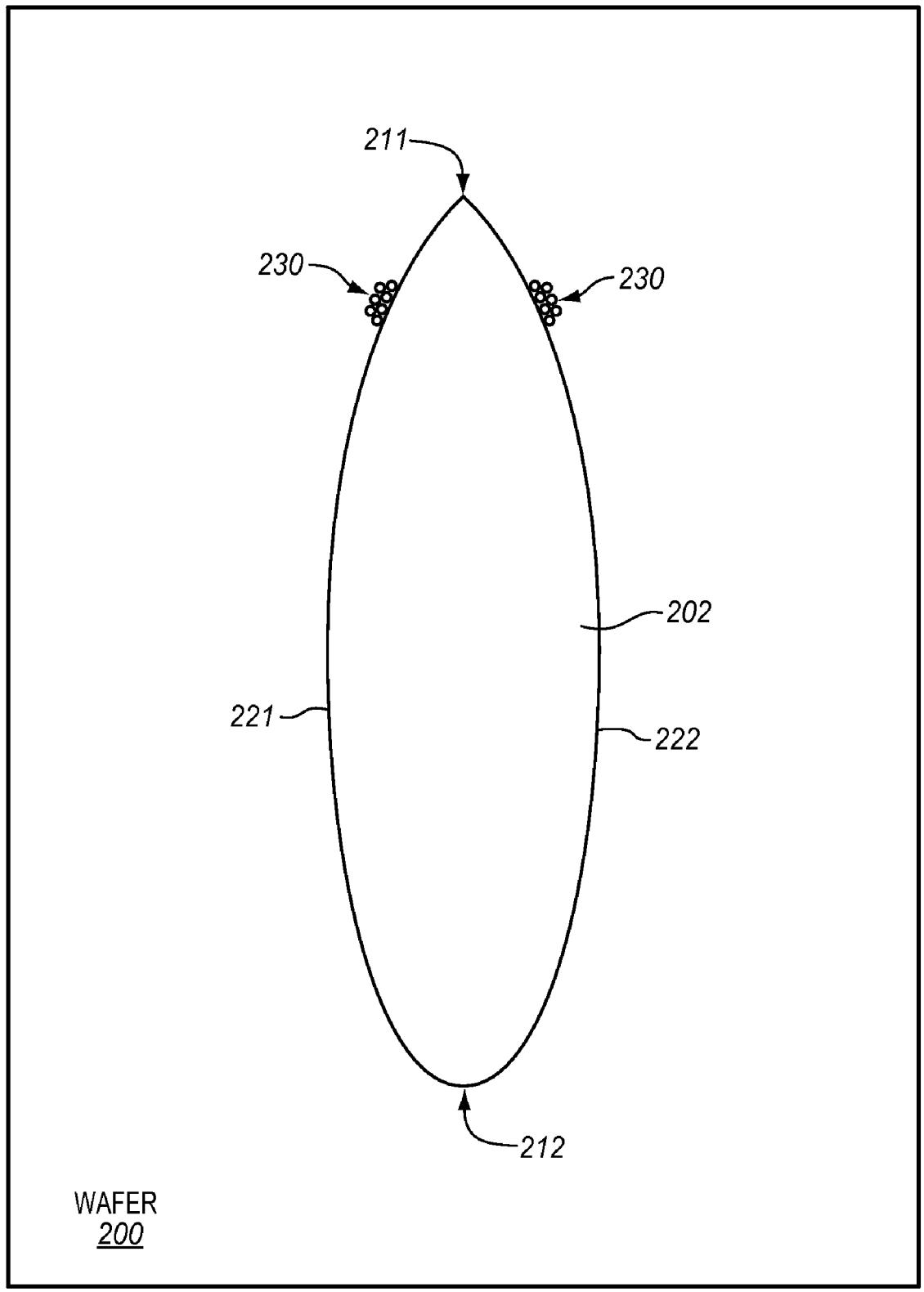
FIG. 2 is a top view of a wafer with a structure fabricated on the wafer in an exemplary embodiment of the invention.

The structures fabricated in step 102 have an effective shape that is aerodynamic. FIG. 2 is a top view of a wafer 200 with a structure 202 fabricated on wafer 200 in an exemplary embodiment of the invention. Although a single structure 202 is shown in FIG. 1, those skilled in the art will appreciate that multiple structures 202 may be formed on wafer 200. To form the aerodynamic shape, structure 202 includes a first end 211 and a second end 212. Structure 202 also includes two side surfaces 221-222 that connect between ends 211-212. Side surfaces 221-222 each have a curved, bowed, or arched shape between ends 211-212 so that the external boundary of structure 202 has an elliptical or teardrop-type shape. This teardrop-type shape is substantially aerodynamic.

The aerodynamic shape of structure 202 may be more accurately defined such that a horizontal cross-section of structure 202 is defined from a NACA series. NACA (National Advisory Committee for Aeronautics) has defined a variety of airfoil shapes and associated equations that precisely generate cross-sections of airfoils. A NACA series refers to these defined airfoil shapes and associated equations. Thus, one or more NACA series may be used as a guide to generate or define an aerodynamic shape of structure 202.

Structure 202 may not have a perfectly aerodynamic shape as shown in FIG. 2 and may deviate slightly. The "effective" shape of structure 202 is substantially aerodynamic, meaning that the approximate outer boundary of structure 202 is aerodynamic. In actual fabrication, structure 202 may include slight indentations along surfaces 221-222 so that the surfaces are not perfectly curved. However, the shape of structure 202 in effect functions as an aerodynamic shape to achieve the desired aerodynamic characteristics.

As previously described, it is a problem in wafer fabrication that residual materials may remain on wafer 200 after lithographic processes are performed to fabricate structure 202. FIG. 2 illustrates some residual material 230 on each of side surfaces 221-222 of structure 202. To remove the residual material 230, a cleaning process is performed on wafer 200. A typical cleaning process uses a fluid (e.g., a liquid or gas) flow to remove the residual materials 230, which is provided in step 104 of FIG. 1.

Figure 3:
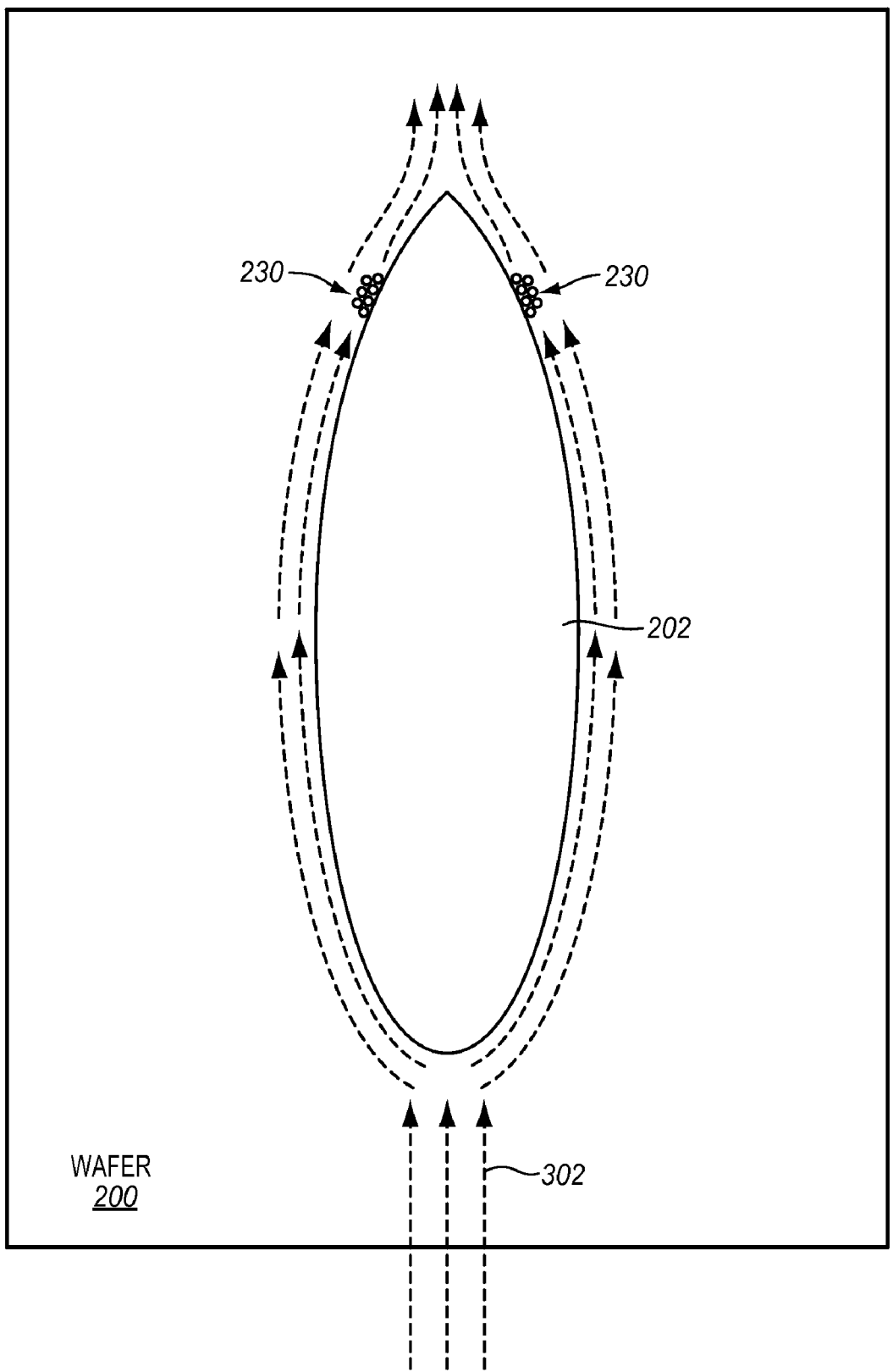
FIG. 3 illustrates a fluid flow being directed toward a structure in an exemplary embodiment of the invention.

Step 104 comprises directing a fluid flow toward a leading edge of structure 202 to remove the residual material 230 in a cleaning process. The leading edge of an aerodynamic shape comprises the edge where fluid flow lines separate to take separate paths around structure 202 when directed from a preferred attack angle with a minimum amount of turbulence. The leading edge of structure 202 is first end 212 in this embodiment. FIG. 3 illustrates a fluid flow 302 being directed toward structure 202 in an exemplary embodiment of the invention. Fluid flow 302 may comprise a supercritical carbon dioxide ($CO_2$) flow or another type of fluid flow.

Figure 4:
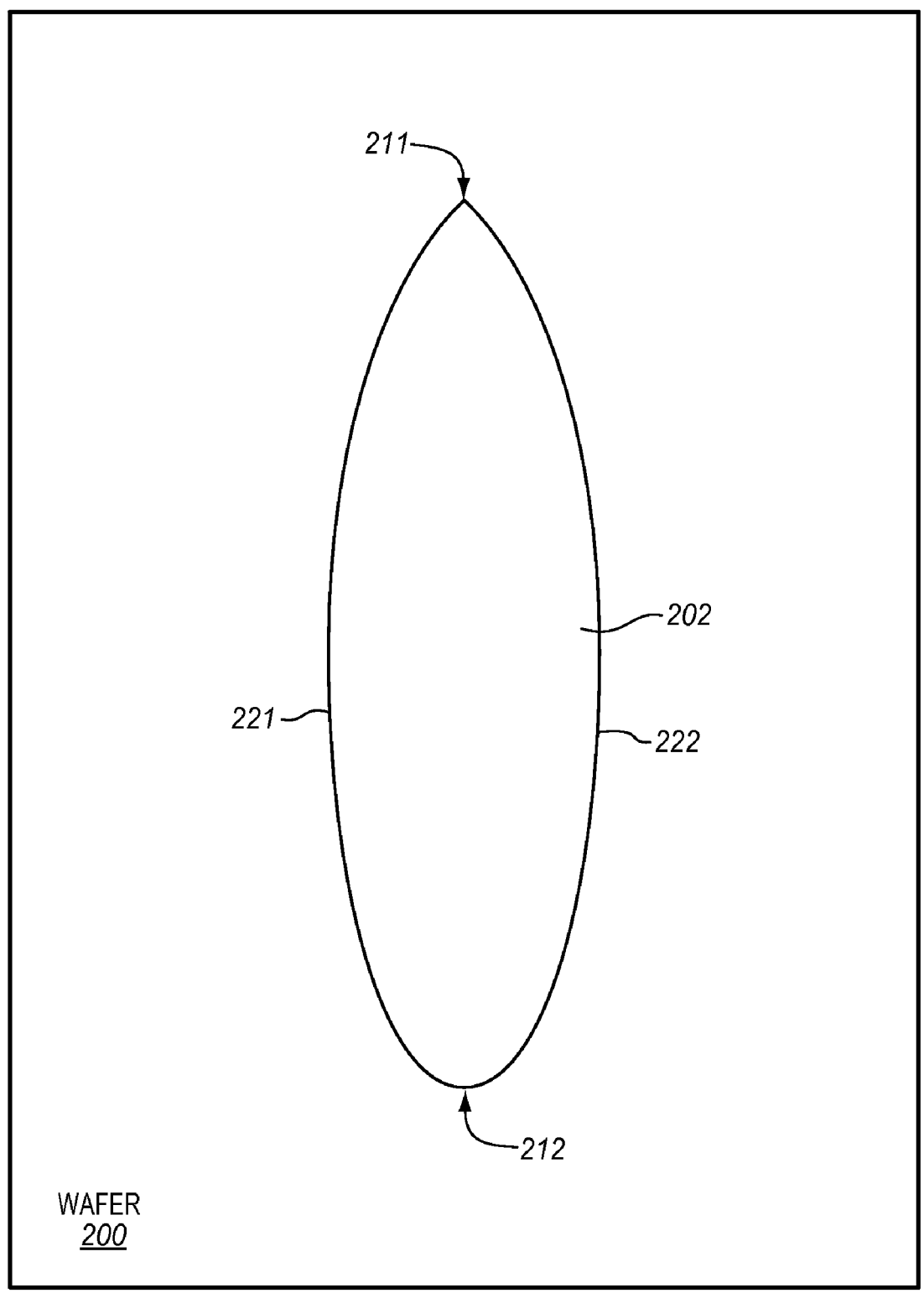
FIG. 4 illustrates a structure with the residual material removed due to a cleaning process in an exemplary embodiment of the invention.

Due to the aerodynamic shape of structure 202, the fluid flow 302 follows paths substantially along the shape of structure 202. Thus, the residual material 230 is exposed to the flow 302 and is removed. FIG. 4 illustrates structure 202 with the residual material 230 removed due to the cleaning process in an exemplary embodiment of the invention.

The aerodynamic shape of structure 202 provides many advantages over the shapes of prior structures formed on a wafer. The aerodynamic shape allows the cleaning process to remove the residual materials 230 from structure 202 more effectively because there are fewer low pressure areas where the residual materials 230 can avoid the flow 302 (see FIG. 3). Also, the shape of structure 202 allows the flow 302 to be directed towards structure 202 from a single angle, which is toward the leading edge 212. At this angle (also referred to as the attack angle), the flow 302 follows paths around virtually the entire surface of structure 202. Thus, residual materials 230 can be removed from any surface of structure 202 when the flow 302 is directed from this single angle.

Another advantage of the aerodynamic shape of structure 202 is that flow 302 reduces the shear force on structure 202, and, consequently, is less likely to be damaged by the cleaning process even if structure 202 is fragile. As a result, more aggressive cleaning processes (i.e., higher pressure) may be used in the cleaning process with less risk of damaging structure 202 during the cleaning process.

In one specific embodiment of the invention, the concept of using aerodynamic shapes for structures fabricated on a wafer may be extended to fabricating write poles in a magnetic recording head. As densities of magnetic disk drives have increased, the size of write poles in a magnetic recording head have decreased. For example, the pole tip of a write pole may be 0.1 microns or less. As a result, the pole tip of the write pole is fragile and vulnerable to damage in cleaning processes and other fabrication processes.

Figure 5:
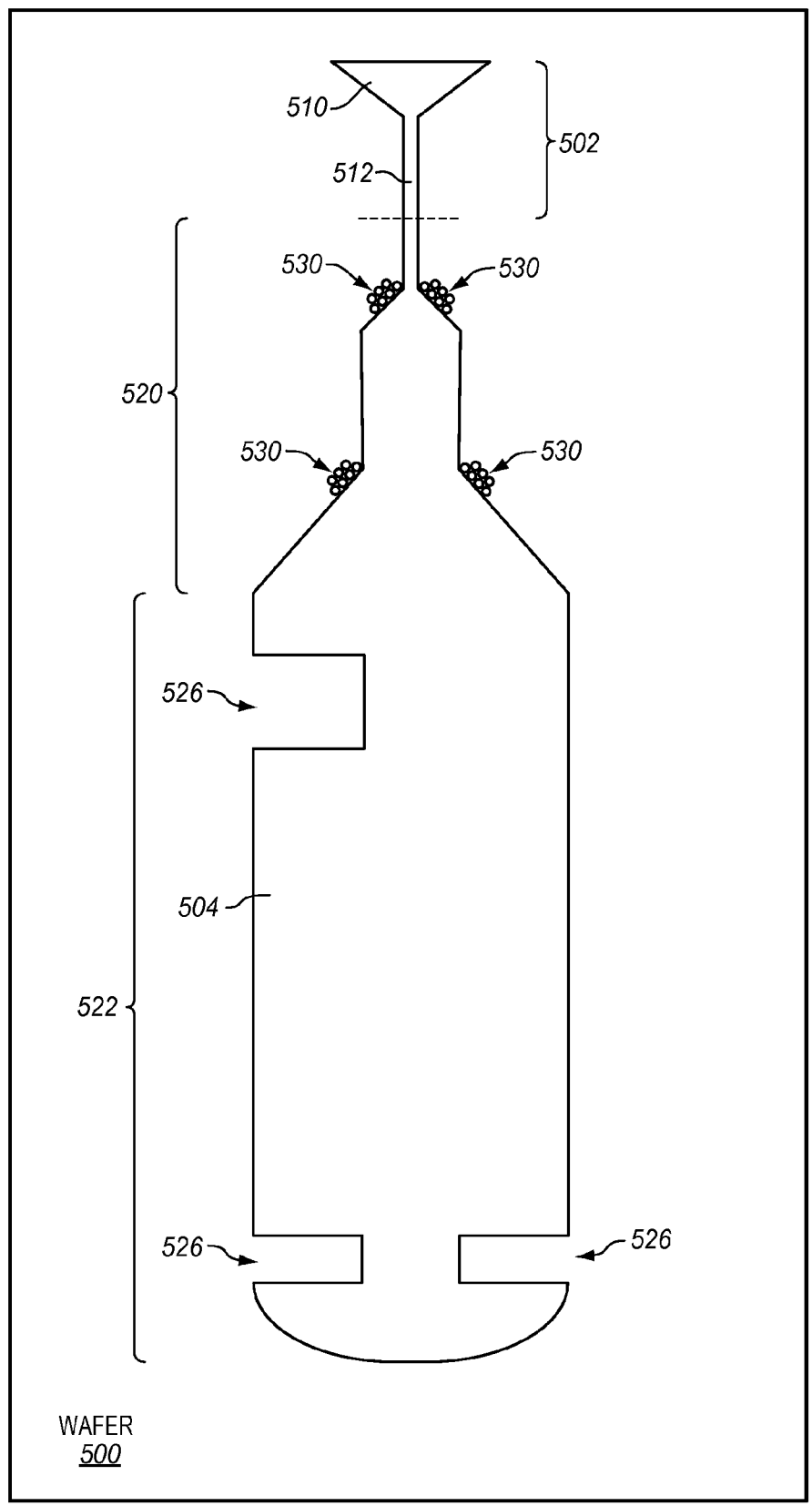
FIG. 5 is a top view of a wafer with a write pole being fabricated along with an anchor structure.

To stabilize the pole tip during fabrication, an anchor structure is fabricated integral with the pole tip. FIG. 5 is a top view of a wafer 500 with a write pole 502 being fabricated along with an anchor structure 504. Write pole 502 is comprised of a yoke portion 510 and a pole tip 512. Anchor structure 504 is fabricated in the same deposition and removal steps as write pole 502 so that anchor structure 504 is integral with (or connected to) pole tip 512. Anchor structure 504 generally has a neck portion 520 and a base portion 522. The neck portion 520 refers to the part of anchor structure 504 that has a width substantially similar to pole tip 512, but then expands to a much larger width in order to stabilize pole tip 512. The base portion 522 refers to the remainder of anchor structure 504 having a much larger width than pole tip 512. Anchor structure 504 may include indentations 526 as illustrated in FIG. 5 which are used for other fabrication processes that are irrelevant for this discussion.

Anchor structure 504 is used to stabilize write pole 502, and more particularly, pole tip 512 during subsequent cleaning processes or other fabrication processes. Anchor structure 504 will be lapped away when the air bearing surface (ABS) is defined for the write pole 52.

As with the previous embodiment, it is a problem in wafer fabrication that residual materials may remain on wafer 500 after a lithographic process is performed to fabricate write pole 502 and anchor structure 504. FIG. 5 illustrates some residual material 530 on surfaces of anchor structure 504. Anchor structure 504 provides particular problems for a subsequent cleaning process. Anchor structure 504 is formed with photolithographic processes, which traditionally use straight lines to define anchor structure 504. Thus, to reduce the width of anchor structure 504 in neck portion 520 from a large width to a width of pole tip 512, the surfaces of anchor structure 504 angle toward the center of anchor structure 502 a first time, and then angle inwardly toward the center a second time. The locations where the surfaces of anchor structure 504 change angles create low pressure regions where residual material 530 may congregate. Thus, if a cleaning process directs a fluid flow from the bottom of anchor structure 504 (from the bottom of the page in FIG. 5), the fluid flow will not be able to remove the residual material 530 from these low pressure regions. Thus, the cleaning process will have to be performed from multiple angles, which increases processing time and increases the chances of damaging the fragile write pole 502.

Figure 6:
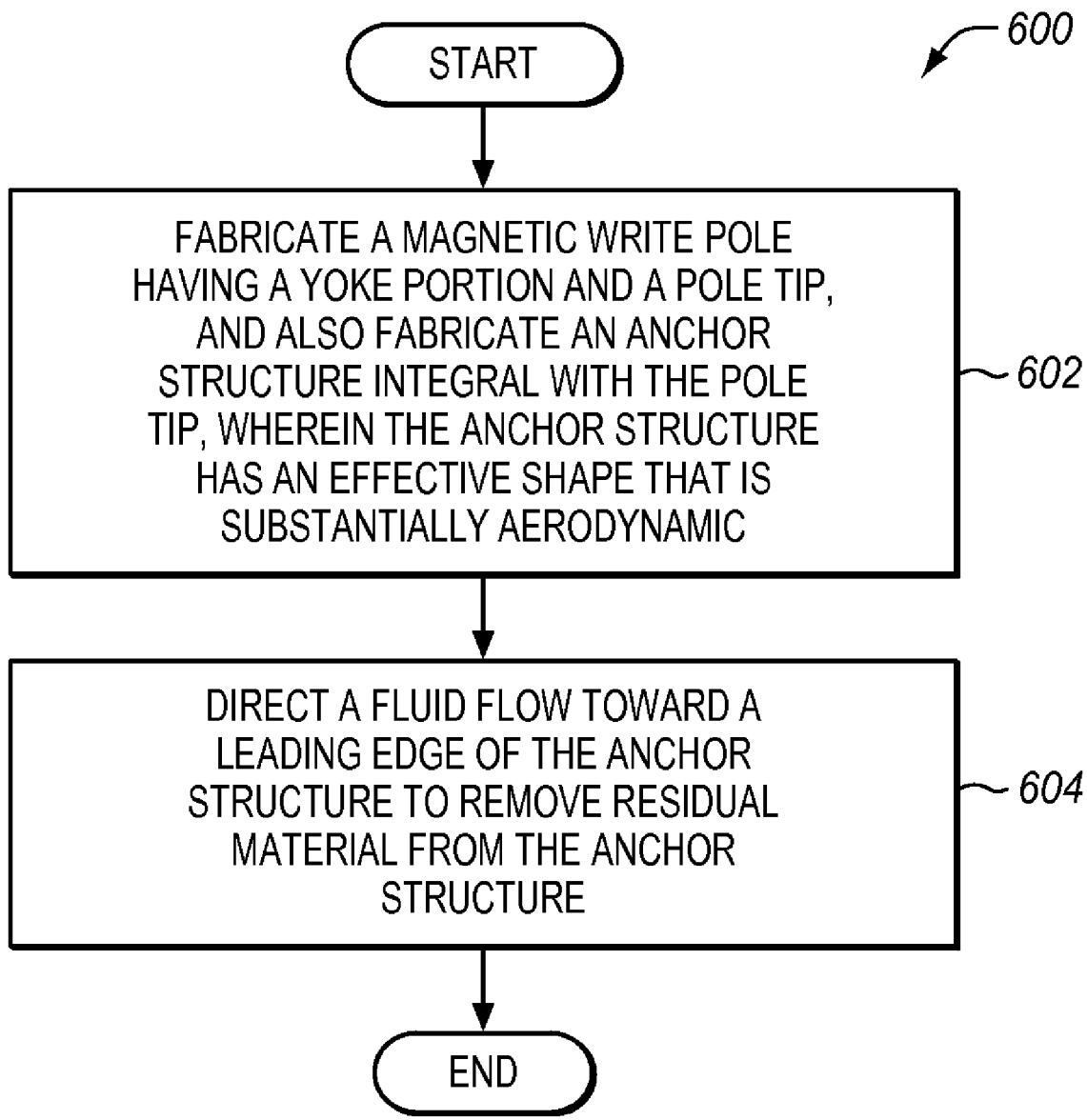
FIG. 6 is a flow chart illustrating a method of fabricating magnetic recording heads on a wafer to facilitate cleaning of the wafer subsequent to lithographic processes patterning layers of the magnetic recording heads in an exemplary embodiment of the invention.

To alleviate this problem, an anchor structure and pole tip may be formed with an aerodynamic structure, which is illustrated in FIGS. 6-9. FIG. 6 is a flow chart illustrating a method 600 of fabricating magnetic recording heads on a wafer to facilitate cleaning of the wafer subsequent to lithographic processes patterning layers of the magnetic recording heads in an exemplary embodiment of the invention. Method 600 is not all-inclusive, and may include other steps not shown for the sake of brevity.

Figure 7:
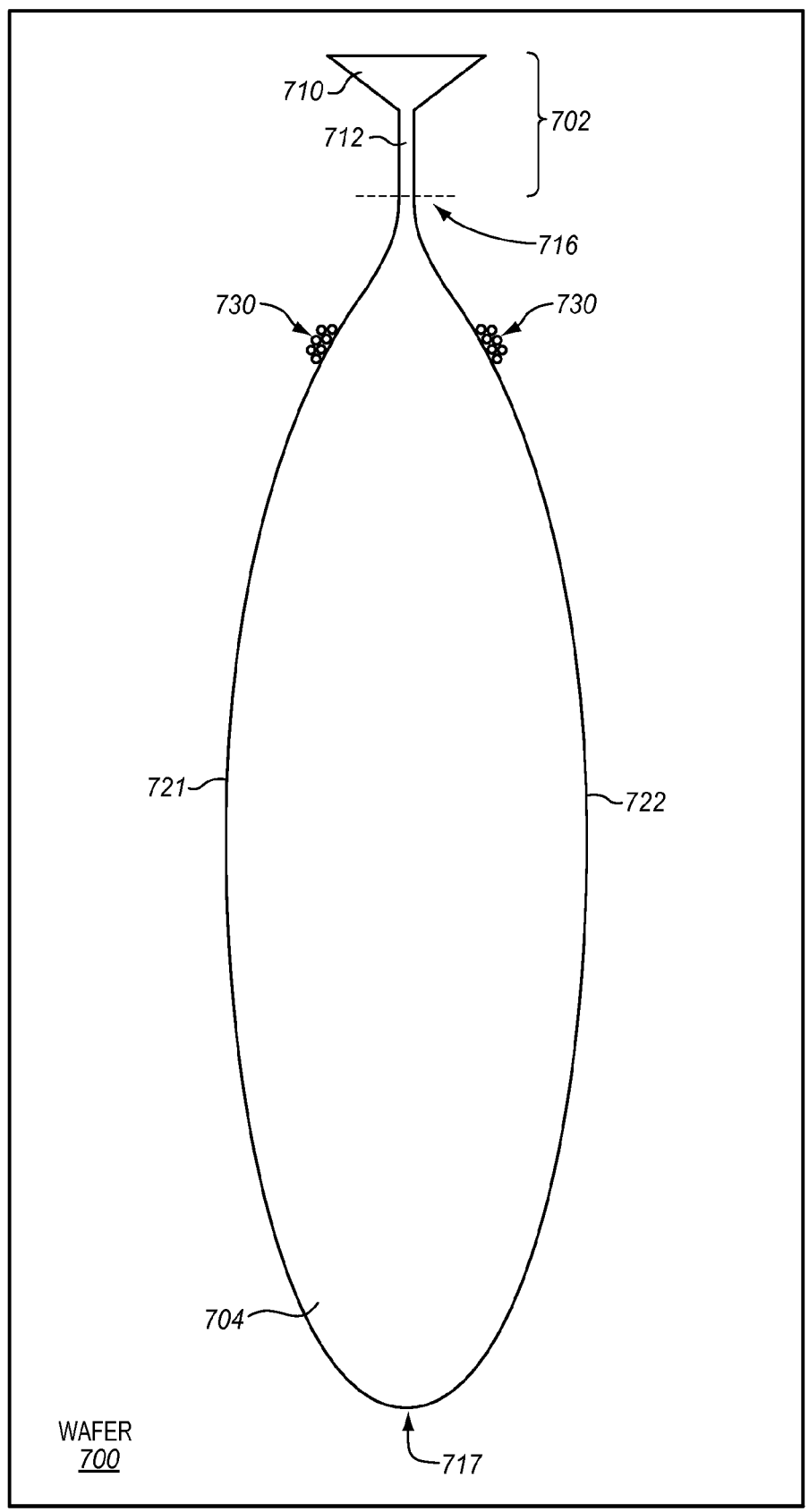
FIG. 7 is a top view of a wafer with a write pole and an anchor structure fabricated on a wafer in an exemplary embodiment of the invention.

Step 602 comprises fabricating a magnetic write pole on a wafer through lithographic processes. Step 602 also comprises fabricating an anchor structure on the wafer. The same lithographic processes may be used to fabricate both the magnetic write pole and the anchor structure. FIG. 7 is a top view of a wafer 700 with a write pole 702 and an anchor structure 704 fabricated on wafer 700 in an exemplary embodiment of the invention. Write pole 702 includes a yoke portion 710 and a pole tip 712. Anchor structure 704 is fabricated to have an effective shape that is substantially aerodynamic. To form the aerodynamic shape, anchor structure 704 includes a first end 716 and a second end 717, with first end 716 formed integral with pole tip 712. Anchor structure 704 also includes two side surfaces 721-722 that connect between ends 716-717. Side surfaces 721-722 each have a curved, bowed, or arched shape between ends 716-717 so that the external boundary of anchor structure 704 has an elliptical or oval-type shape. This elliptical shape is substantially aerodynamic. The aerodynamic shape of anchor structure 704 may be more accurately defined such that a cross-section of anchor structure 704 is defined from a NACA series, as described in the previous embodiment. Pole tip 712 is also substantially aerodynamic.

Anchor structure 704 may not have a perfectly aerodynamic shape as shown in FIG. 7 and may deviate slightly. The "effective" shape of anchor structure 704 is substantially aerodynamic, meaning that the approximate outer boundary of anchor structure 704 is aerodynamic. In actual fabrication, anchor structure 704 may include slight indentations along surfaces 721-722 so that the surfaces are not perfectly curved. However, the shape of anchor structure 704 in effect functions as an aerodynamic shape to achieve the desired aerodynamic characteristics.

As previously described, it is a problem in wafer fabrication that residual materials may remain on wafer 700 after lithographic processes are performed to fabricate write pole 702 and anchor structure 704. FIG. 7 illustrates some residual material 730 on each side surface 721-722 of anchor structure 704. To remove the residual material 730, a cleaning process is performed on wafer 700.

Figure 8:
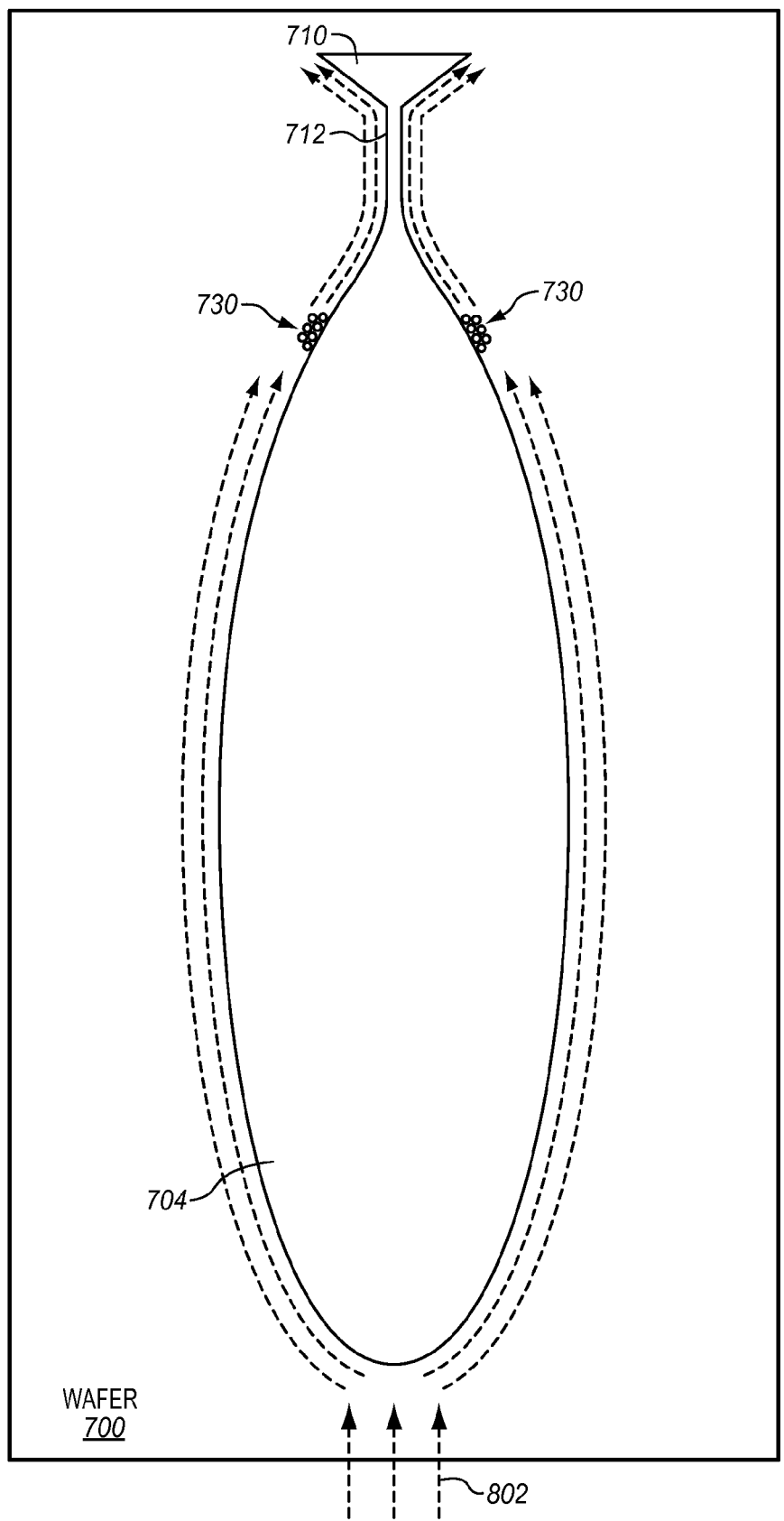
FIG. 8 illustrates a fluid flow being directed toward an anchor structure in an exemplary embodiment of the invention.

Step 604 of FIG. 6 comprises directing a fluid flow toward a leading edge of anchor structure 704 to remove the residual material 730 in a cleaning process. The leading edge of anchor structure 704 is second end 717 in this embodiment. FIG. 8 illustrates a fluid flow 802 being directed toward anchor structure 704 in an exemplary embodiment of the invention. Fluid flow 802 may comprise a supercritical carbon dioxide ($CO_2$) flow or another type of fluid flow.

Figure 9:
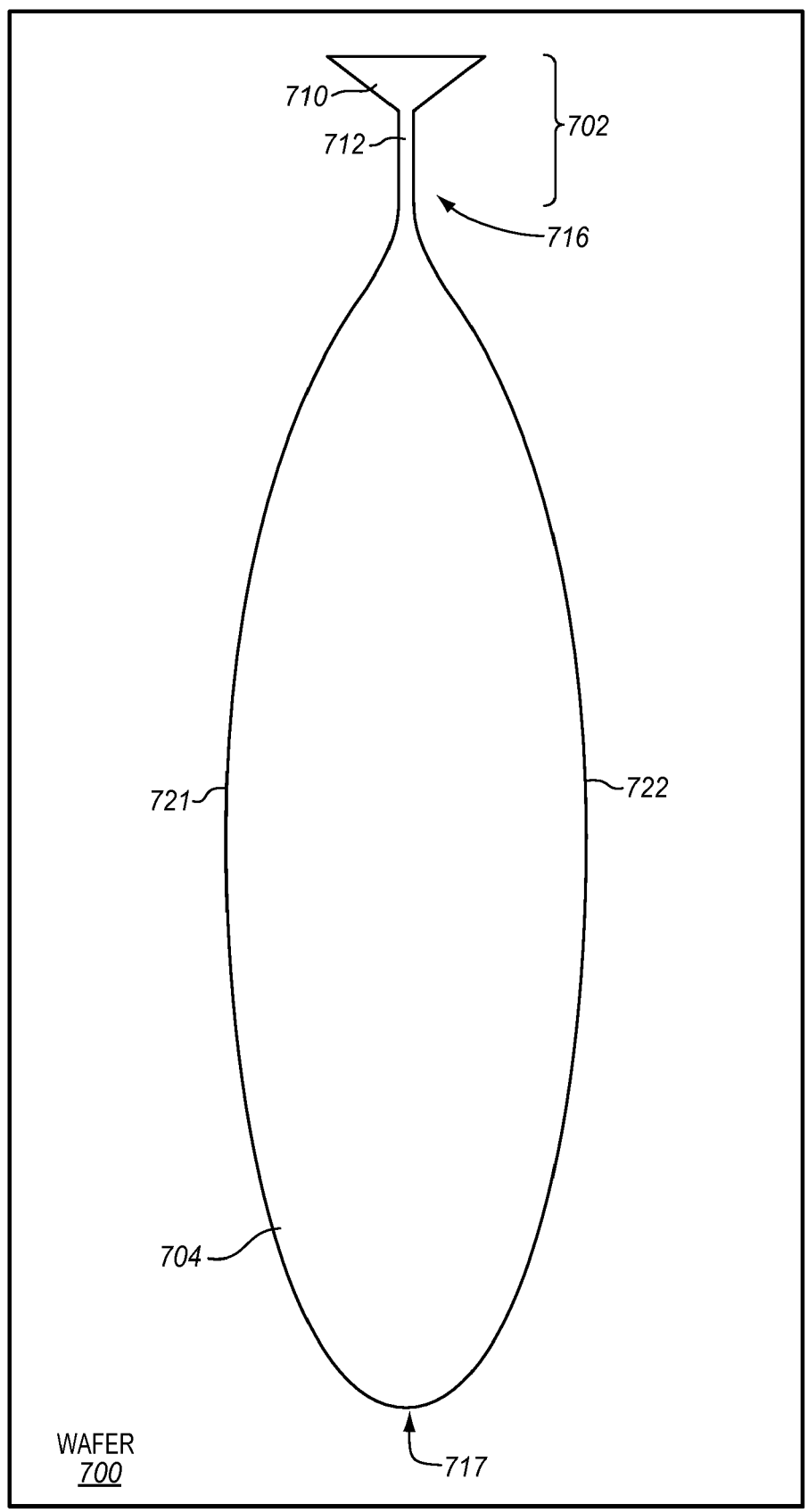
FIG. 9 illustrates an anchor structure with the residual material removed due to a cleaning process in an exemplary embodiment of the invention.

Due to the aerodynamic shape of anchor structure 704, the fluid flow 802 follows paths substantially along the shape of anchor structure 704. Thus, the residual material 730 is exposed to the flow 802 and is removed. FIG. 9 illustrates anchor structure 704 with the residual material 730 removed due to the cleaning process in an exemplary embodiment of the invention.

The aerodynamic shape of anchor structure 704 and pole tip 712 provides many advantages over the shapes of prior anchor structures. For instance, the anchor structure 504 in FIG. 5 is formed with straight lines, and is thus not very aerodynamic. Anchor structure 504 thus has multiple areas where residual material 530 can escape the fluid flow, especially in neck portion 520. Conversely, anchor structure 704 provides fewer areas where residual material 530 can escape the fluid flow due to its aerodynamic shape. The aerodynamic shape allows a cleaning process to remove the residual materials 730 from anchor structure 704 more effectively because there are fewer and smaller areas where the residual materials 730 can escape the flow 802 (see FIG. 8).

Also, the shape of anchor structure 704 allows the flow 802 to be directed towards anchor structure 704 from a single angle, which is toward the leading edge 717. At this angle (also referred to as the attack angle), the flow 802 follows paths around virtually the entire surface of anchor structure 704. Thus, residual materials 730 can be removed from any surface of anchor structure 704 when the flow 802 is directed from this single angle.

Another advantage of the aerodynamic shape of anchor structure 704 is that anchor structure 704 creates less resistance to the flow 802, and is less likely to be damaged by the cleaning process. As a result, more aggressive cleaning processes (i.e., higher pressure) may be used in the cleaning process with less of a risk of damaging anchor structure 704 or write pole 702 during the cleaning process.

Although specific embodiments were described herein, the scope of the invention is not limited to those specific embodiments. The scope of the invention is defined by the following claims and any equivalents thereof.

We claim:

1. A method of wafer fabrication that facilitates cleaning of a wafer subsequent to lithographic processes defining sub-millimeter structures on the wafer, the method comprising:
 fabricating at least one sub-millimeter structure on the wafer that is defined through the lithographic processes to have an effective elliptical shape that is substantially aerodynamic; wherein the at least one sub-millimeter structure includes a first end and a second end, a first side surface connecting the first end to the second end, and a second side surface connecting the first end to the second end; wherein the first side surface and the second side surface each camber between the first end and the second end to form the aerodynamic shape;
 wherein the aerodynamic shape facilitates a subsequent cleaning process in removing residual material from the at least one sub-millimeter structure.

2. The method of claim 1 wherein the aerodynamic shape of a cross-section of the at least one sub-millimeter structure is defined from a NACA (National Advisory Committee for Aeronautics) series.

3. The method of claim 1 further comprising:
 directing a fluid flow substantially toward a leading edge of the at least one sub-millimeter structure to remove the residual material, wherein the leading edge is defined by the end of the aerodynamic shape which first comes into contact with the fluid flow.

4. The method of claim 3 wherein the fluid flow comprises a supercritical carbon dioxide flow.

5. A wafer that is patterned using lithographic processes and also cleaned subsequent to lithographic processes being performed, the wafer comprising:
 at least one sub-millimeter structure defined through the lithographic processes to have an effective teardrop shape that is substantially aerodynamic; wherein the at least one sub-millimeter structure includes a first end and a second end, a first side surface connecting the first end to the second end, and a second side surface connecting the first end to the second end; wherein the first side surface and the second side surface each camber between the first end and the second end to form the aerodynamic shape;
 wherein the aerodynamic shape facilitates a subsequent cleaning process in removing residual material from the at least one sub-millimeter structure.

6. The wafer of claim 5 wherein the aerodynamic shape of a cross-section of the at least one sub-millimeter structure is defined from a NACA (National Advisory Committee for Aeronautics) series.

7. The wafer of claim 5 wherein the cleaning process comprises a fluid flow substantially directed toward a leading edge of the at least one sub-millimeter structure to remove the residual material, wherein the leading edge is defined by the end of the aerodynamic shape which first comes into contact with the fluid flow.

8. The wafer of claim 7 wherein the fluid flow comprises a supercritical carbon dioxide flow.

* * * * *